(12) United States Patent
Horikawa et al.

(10) Patent No.: US 7,276,438 B2
(45) Date of Patent: Oct. 2, 2007

(54) METHOD OF MANUFACTURING WIRING SUBSTRATE

(75) Inventors: Yasuyoshi Horikawa, Nagano (JP); Keiichi Takemoto, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 196 days.

(21) Appl. No.: 11/135,350

(22) Filed: May 24, 2005

(65) Prior Publication Data

US 2005/0277282 A1   Dec. 15, 2005

(30) Foreign Application Priority Data

Jun. 14, 2004  (JP) .............................. 2004-174969

(51) Int. Cl.
*H01L 29/06* (2006.01)
(52) U.S. Cl. ...................... 438/618; 438/660; 438/680; 438/692; 257/E21.17; 257/E21.01; 257/E21.084; 257/E21.304; 257/E21.585
(58) Field of Classification Search ................ 438/618, 438/612, 617, 687, 688, 689, 692, 680, 660, 438/637, 598, 678, 781, 779, 780
See application file for complete search history.

(56) References Cited

U.S. PATENT DOCUMENTS

2006/0012967 A1 * 1/2006 Asai et al. ................... 361/764

FOREIGN PATENT DOCUMENTS

| JP | 2001-352166 | * 12/2001 |
| JP | 2002-289999 | 10/2002 |
| JP | 2003-220595 | 8/2003 |

* cited by examiner

*Primary Examiner*—David Nhu
(74) *Attorney, Agent, or Firm*—Kratz, Quintos & Hanson, LLP.

(57) ABSTRACT

A method of manufacturing a wiring substrate of the present invention, includes a step of preparing a substrate containing a semi-cured resin layer or a thermo plastic resin layer, a step of forming a through hole that passes through the substrate, a step of inserting a conductive parts in the through hole, a step of curing the semi-resin layer or the thermo plastic resin layer in a state that the resin layer is made to flow by applying a thermal press to the substrate and filling a clearance between the through hole and the conductive parts with the resin layer, and a step of forming a wiring pattern, which is connected mutually via the conductive parts, on both surface sides of the substrate.

10 Claims, 10 Drawing Sheets

METHOD OF MANUFACTURING WIRING SUBSTRATE

CROSS-REFERENCE TO RELATED APPLICATIONS

This application is based on and claims priority of Japanese Patent Application No. 2004-174969 filed on Jun. 14, 2004, the entire contents of which are incorporated herein by reference.

BACKGROUND OF THE INVENTION

1. Field of the Invention

The present invention relates to a method of manufacturing a wiring substrate and, more particularly, a method of manufacturing a wiring substrate having a structure that enable conduction of both surface sides of a core substrate via through holes provided in the core substrate.

2. Description of the Related Art

In the prior art, there is the wiring substrate having the structure in which the wiring patterns formed on both surface sides of the core substrate are connected mutually via the conductors provided in the through holes in the core substrate.

As the method of manufacturing such wiring substrate, as shown in FIG. 1A, at first through holes 100x are formed in a core substrate 100 made of a glass epoxy resin, or the like, and then insides of the through holes 100x are cleaned by a desmear process using a permanganic acid, or the like. Then, as shown in FIG. 1B, a seed layer (not shown) is formed on both surfaces of the core substrate 100 and side surfaces of the through holes 100x by the electroless plating, and then a metal layer (not shown) is formed on the seed layer by the electroless plating utilizing the seed layer as a plating-power feeding layer, and thus first conductive layers 102 are obtained. Accordingly, both surface sides of the core substrate 100 can be brought into a conductive condition via the first conductive layer 102 provided in the through holes 100x. At this time, cavity is left in the through holes 100x in the core substrate 100 respectively.

Then, as shown in FIG. 1C, an insulating resin body 104 is filled in the cavities of the through holes 100x. Then, as shown in FIG. 1D, projected portions of the insulating resin bodies 104 projected from the first conductive layer 102 are polished on both surface sides of the core substrate 100 respectively. Thus, an upper surface and a lower surface of the insulating resin body 104 are planarized to get substantially coplanar surfaces with exposed surfaces of the first conductive layers 102 on the upper side and the lower side of the core substrate 100 respectively.

Then, as shown in FIG. 1E, a resultant structure in FIG. 1D is cleaned by applying the desmear process thereto, then a seed layer (not shown) is formed on the first conductive layer 102 on both surface sides of the core substrate 100 by the electroless plating respectively, and then a metal layer (not shown) is formed on the seed layer by the electroplating utilizing the seed layer as the plating-power feeding layer, and thus a second conductive layer 106 is obtained on both surface sides respectively.

Then, as shown in FIG. 1F, wiring patterns 108 each composed of the first and second conductive layers 102, 106 are formed on both surfaces by patterning the second conductive layer 106 and the first conductive layer 102. In this manner, the wiring patterns 108 on both surface sides of the core substrate 100 are connected mutually via the first conductive layers 102 in the through holes 100x in the core substrate 100.

In the above method of manufacturing the wiring substrate, the steps of the desmear process, the electroless plating, and the electroplating are required in the case of forming the first conductive layers 102 for enabling conduction of both surface sides of the core substrate mutually, in the through holes 100x respectively. As a result, such problems exist that the manufacturing steps become complicated because many manufacturing steps are needed, and the heavy burden of the chemicals preparation and the liquid waste processing is imposed.

In order to overcome such problems, instead of the process of forming the conductive layer in the through holes of the core substrate by the plating, there is the manufacturing method of inserting the metal posts into the through holes.

That is, as shown in FIG. 2A and FIG. 2B, the through holes 100x are formed in the core substrate 100, and then metal posts 110 are inserted into the through holes 100x. Then, as shown in FIG. 2C and FIG. 2D, a conductive layer 112 is formed on both surfaces of the core substrate 100 by the electroless plating and the electroplating respectively, and then wiring patterns 114 are formed by patterning the conductive layer 112 on both surfaces respectively. Accordingly, the wiring patterns 114 formed on both surfaces of the core substrate 100 respectively are connected mutually via the metal posts 110 in the through holes 100x.

The wiring substrate having the structure in which the metal posts are inserted into the through holes provided in the core substrate is set forth in Patent Literature 1 (Patent Application Publication (KOKAI) 2002-289999), Patent Literature 2 (Patent Application Publication (KOKAI) 2003-220595), and Patent Literature 3 (Patent Application Publication (KOKAI) 2001-352166), for example.

FIG. 3 is an enlarged sectional view showing a behavior between the through hole 100x in the core substrate 100 and the metal post 110 in FIG. 2B.

As shown in FIG. 3, in the case of inserting the metal post 110 into the through hole 100x in the core substrate 100, a clearance G is ready to occur between the through hole 100x and the metal post 110. This is because it is difficult to reconcile an inner diameter of the through hole 100x with an outer diameter of the metal post 110 perfectly and also the defects such that the metal post 110 is bent partially upon inserting the metal post 110 into the through hole 100x, and the like are caused.

When the clearance occurs between the through hole 100x and the metal post 110, the plating is not partially applied owing to the influence of the clearance G in forming the wiring patterns 114 on both surface side of the core substrate 100, and thus there is such a possibility that the wiring patterns 114 are disconnected.

Also, in case the top end portions of the metal posts 110 are projected excessively from the core substrate 100, the projected portions of the metal posts 110 must be removed by the polishing or the etching to get the flat surface. In the prior art, since the metal posts 110 are not perfectly fixed to the through holes 100x, sometimes the metal posts 110 drop out at the time of polishing, or the etchant sinks into the clearance to etch unnecessarily the metal posts 110 at the time of etching.

As described above, in the method of inserting the metal posts 110 into the through holes 100x of the core substrate 100 according to the prior art, the disadvantages such as the connection failure between the metal posts 110 and the wiring patterns 114, and the like are ready to generate and thus it is extremely difficult to manufacture the highly-reliable wiring substrate at high yield.

SUMMARY OF THE INVENTION

It is an object of the present invention to provide a method of manufacturing a wiring substrate, capable of connecting mutually wiring patterns on both surface sides of a core substrate with good reliability without any disadvantage by inserting conductive parts (metal posts) into through holes in the core substrate.

A method of manufacturing a wiring substrate of the present invention, comprises the steps of preparing a substrate including a semi-cured resin layer or a thermo plastic resin layer; forming a through hole that passes through the substrate; inserting a conductive parts in the through hole; curing the semi-cured resin layer or the thermo plastic resin layer in a state that the resin layer is made to flow by applying a heat and a pressure to the substrate, and filling a clearance between the through hole and the conductive parts with the resin layer; and forming a wiring pattern, which is connected mutually via the conductive parts, on both surface sides of the substrate.

In the present invention, first the substrate including the semi-cured resin layer or the thermo plastic resin layer is prepared. As such substrate, the substrate in which the rigid substrate (the cured resin layer or the metal plate) is put between two semi-cured resin layers or two thermo plastic resin layer is employed preferably. Then, the through holes passing through the substrate are formed and then the conductive parts (metal posts) are inserted thereinto.

Then, the semi-cured resin layers or the thermo plastic resin layers of the substrate are cured while causing to flow by applying the heat and the pressure, and thus the clearances between the through holes of the core substrate and the conductive parts are filled with the resin. Therefore, the conductive parts are fixed completely in the core substrate. Then, the wiring patterns connected mutually via the conductive parts are formed on both surface sides of the core substrate respectively.

In this manner, by employing the method of inserting the conductive parts to the through holes of the substrate, since manufacturing steps can be reduced rather than the case where the conductive layer is formed in the through holes of the core substrate by the plating, a reduction in production cost can be attained. Also, since the step of applying the chemicals can be reduced, a burden on the chemicals management can be reduced remarkably.

Further, the clearances between the through holes of the substrate and the conductive parts are filled readily with the semi-cured resin layers that are caused to flow. Therefore, the wiring patterns can be connected electrically to the conductive parts with good reliability, and thus production yield and reliability of the wiring substrate can be improved.

In the above invention, when a length of the conductive parts in an insertion direction is shorter than a thickness of the substrate, the resin layer is made to flow and is formed on the upper surfaces and the lower surfaces of the conductive parts, and the step of removing the resin layer on the upper surface and the lower surface of the conductive parts is further provided before the step of forming the wiring pattern.

Also, in the above invention, when a length of the conductive parts in an insertion direction is longer than a thickness of the substrate, the step of removing the projected portions of the conductive parts projecting from the substrate to planarize is further provided after the step of filling the clearance between the through hole and the conductive parts with the resin layer (before the step of forming the wiring pattern).

Also, in the above invention, the coaxial type conductive parts having the structure in which the outer peripheral portion of the metal post is covered with the insulator may be employed as the conductive parts. In this case, in addition to the cured resin layer, the metal plate may be employed as the rigid substrate constituting the substrate.

As described above, according to the present invention, the wiring patterns on both surface sides of the core substrate can be connected mutually via the conductive parts with good reliability without any disadvantage by inserting the conductive parts into the through holes in the core substrate.

DETAILED DESCRIPTION OF THE PREFERRED EMBODIMENTS

Embodiments of the present invention will be explained with reference to the accompanying drawings hereinafter.

First Embodiment

FIGS. 4A to 4H are sectional views showing sequentially a method of manufacturing a wiring substrate according to a first embodiment of the present invention.

Figure 4A:
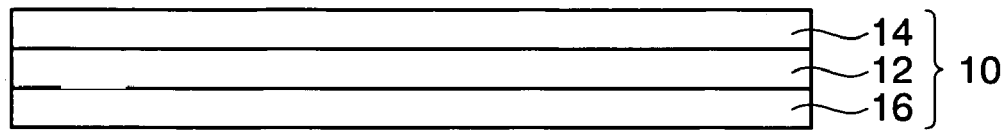
FIGS. 4A to 4H are sectional views showing a method of manufacturing a wiring substrate according to a first embodiment of the present invention.

In the method of manufacturing the wiring substrate according to the first embodiment of the present invention, first, a core substrate 10 such as shown in FIG. 4A is prepared. The core substrate 10 is composed to have a three-layered structure containing a semi-cured resin layer, and is composed of a cured resin layer 12 arranged in the middle portion, a first semi-cured resin layer 14 formed on an upper surface of the cured resin layer 12, and a second semi-cured resin layer 16 formed on a lower surface of the cured resin layer 12. A thickness of the core substrate 10 is 0.4 to 0.8 mm in total, for example.

In this case, thermo plastic resin layers may be employed instead of the first semi-cured resin layer 14 and the second semi-cured resin layer 16.

As the material of respective layers constituting the core substrate 10, the prepreg made of the carbon fiber, the glass fiber, the aramid fiber, or the like is impregnated with a thermosetting resin (epoxy resin, or the like) is preferably employed. The cured resin layer 12 is a rigid substrate whose resin has already been completely cured. The first and second semi-cured resin layers 14, 16 are in a semi-cured condition (B-stage) in this step, and are completely cured by the annealing applied in the later steps.

In the present embodiment, from a viewpoint of give rigidity to the core substrate 10, the resins containing various fibers are employed as the cured resin layer 12 and the first and second semi-cured resin layers 14, 16. But resins not containing the above fibers may be employed. Alternately, the semi-cured resin layers may be employed as the core substrate 10 as a whole.

In addition, instead of the cured resin layer 12, the metal plate made of copper (Cu), nickel (Ni), aluminum (Al), or the like may be employed to make the core substrate 10 have the rigidity.

Figure 4B:
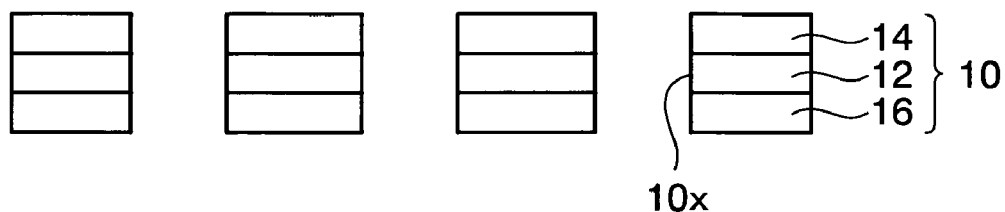

Then, as shown in FIG. 4B, through holes 10x passing through the core substrate 10 are formed by the punching. A diameter of the through hole is set to 0.15 to 0.35 mm and also a pitch between the through holes is set to 300 to 1250 μm, for example.

Figure 4C:
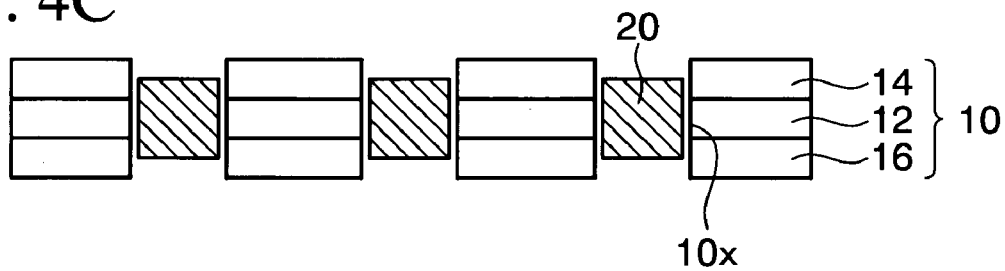

Then, as shown in FIG. 4C, conductive parts 20 inserted into the through holes 10x of the core substrate 10 are prepared. As the conductive parts 20, a metal post obtained by cutting a metal wire made of copper (Cu), nickel (Ni), solder, or their alloy into a predetermined length is preferably employed. As explained in variations described later, in case the metal plate is employed instead of the cured resin layer 12 of the core substrate 10, a coaxial type conductive parts made of the metal post whose outer peripheral portion is covered with an insulator is employed to prevent an electrical short-circuit.

Then, the conductive parts 20 are inserted into the through holes 10x of the core substrate 10. A length of the conductive parts 20 in the insertion direction is appropriately adjusted to meet a thickness of the core substrate 10, and is set to 0.3 to 0.9 mm, for example.

Figure 1A:
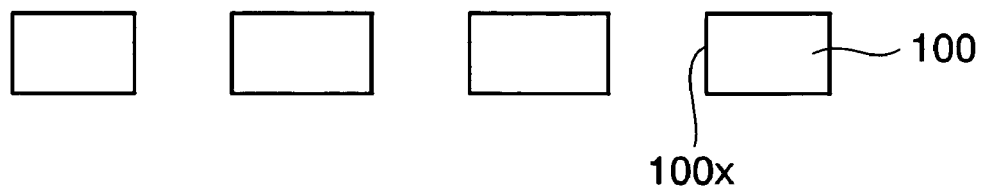
FIGS. 1A to 1F are sectional views showing a method of manufacturing a wiring substrate in the prior art.
Figure 1B:
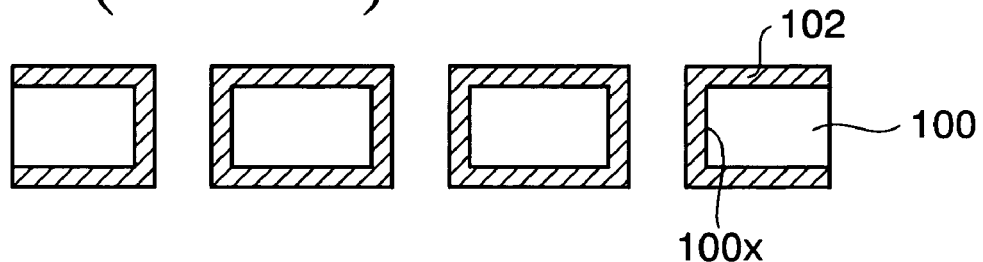
Figure 1C:
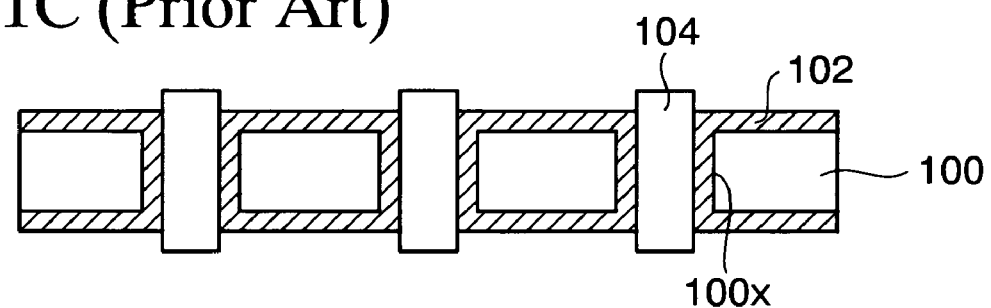
Figure 1D:
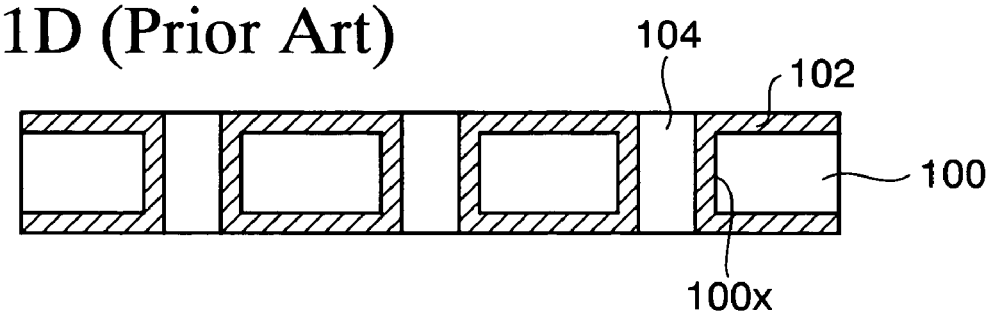
Figure 1E:
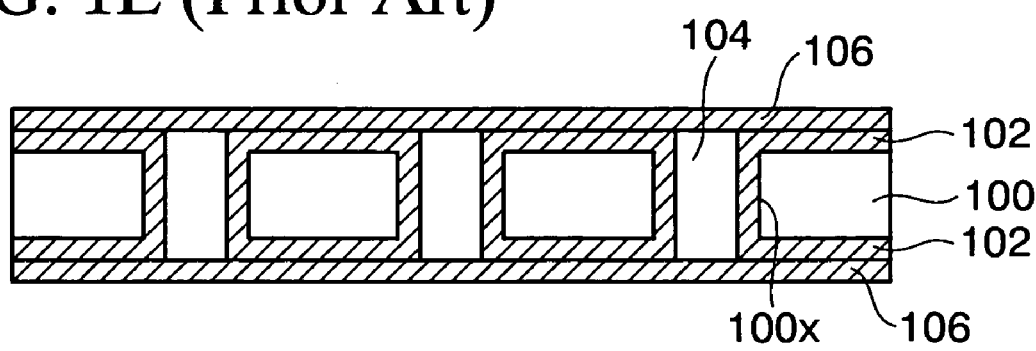
Figure 1F:
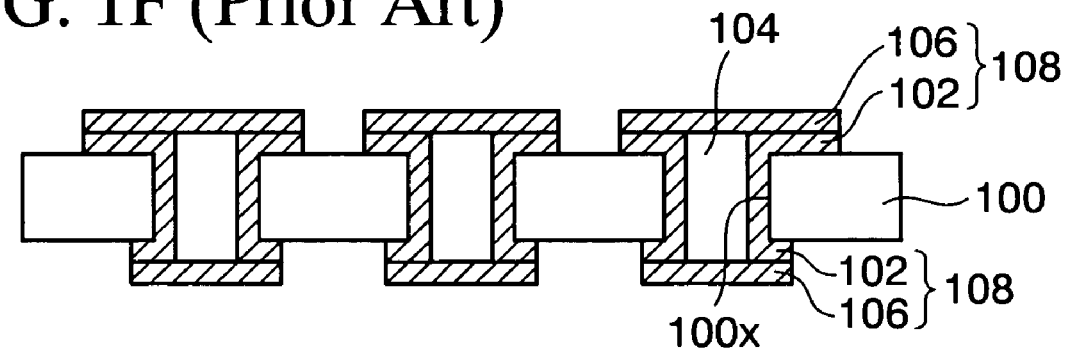
Figure 2A:
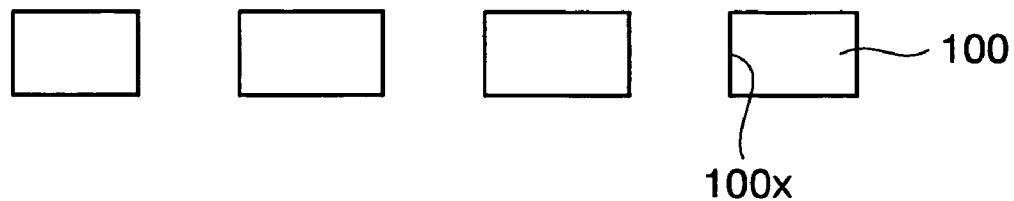
FIGS. 2A to 2D are sectional views showing another method of manufacturing a wiring substrate in the prior art.
Figure 2B:
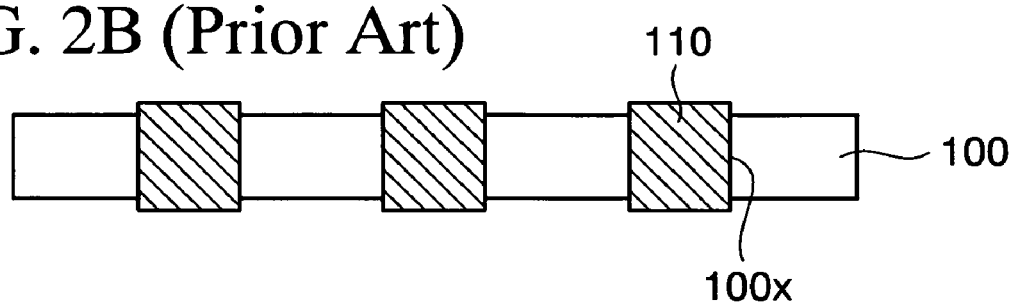
Figure 2C:
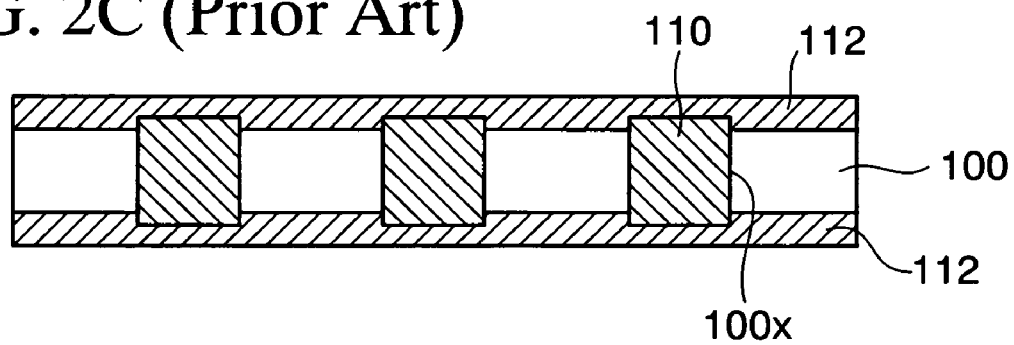
Figure 2D:
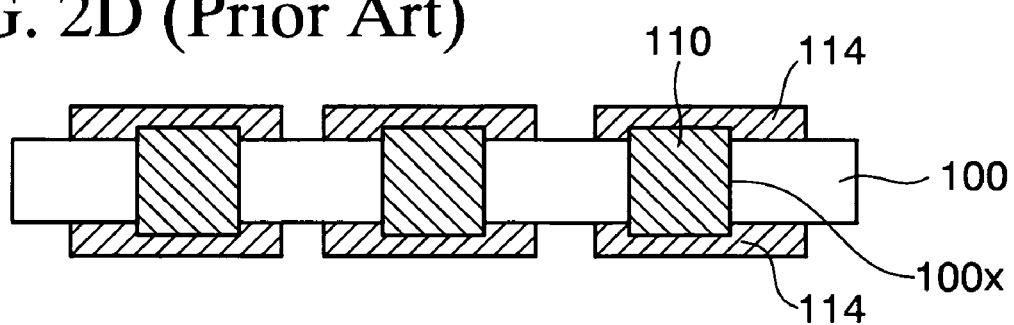
Figure 3:
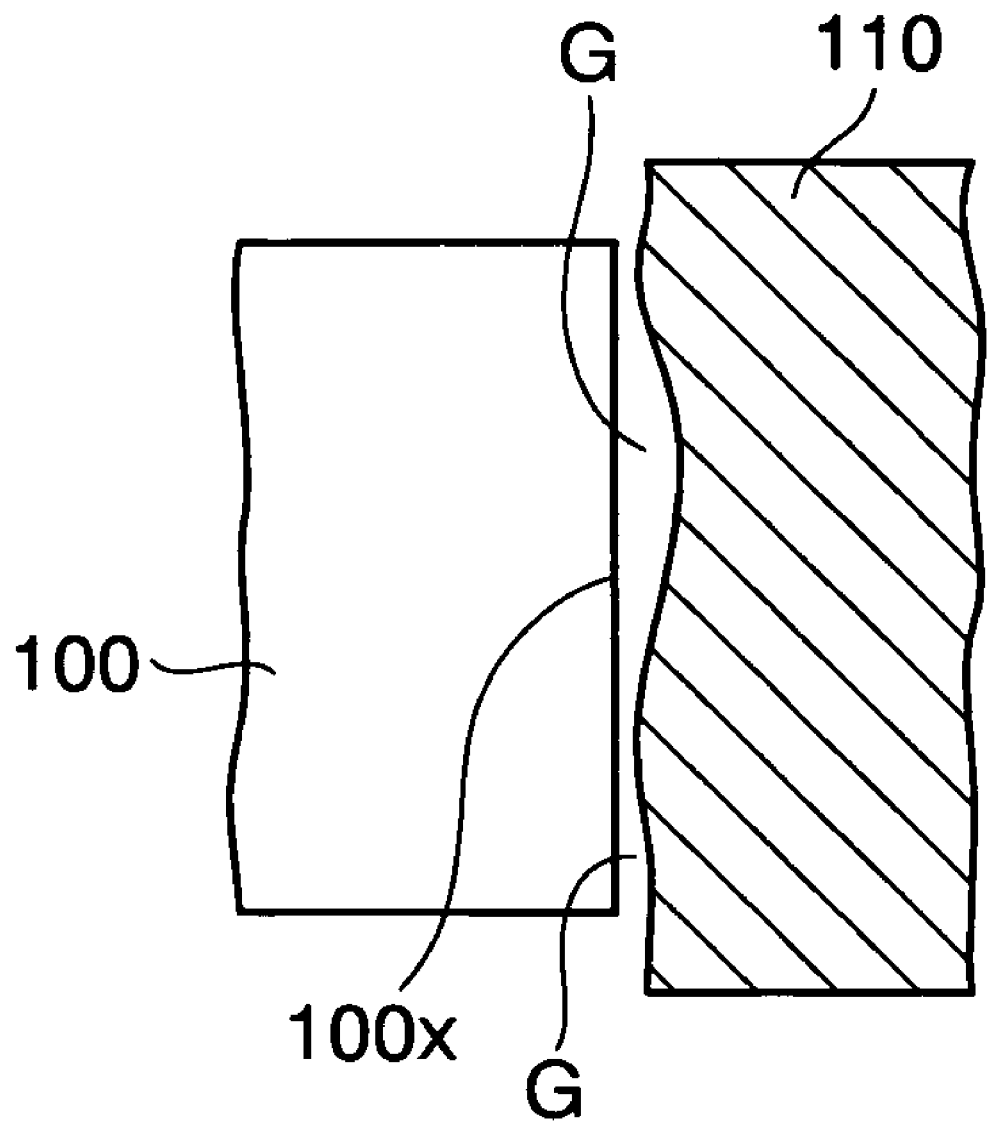
FIG. 3 is a fragmental enlarged sectional view showing a behavior between a through hole in a core substrate and a metal post in an enlarged fashion.

In the first embodiment, the case where the length of the conductive parts 20 in the insertion direction is shorter than the thickness of the core substrate 10 will be explained by way of example hereunder. At this time, the conductive parts 20 are temporarily fixed to the through holes 10x, nevertheless a clearance is produced between the through hole 10x and the conductive parts 20, as explained in FIG. 3 in the prior art. In addition, an upper surface and a lower surface of the conductive parts 20 are arranged in a state that these surfaces are positioned lower than an upper surface of the first semi-cured resin layer 14 and a lower surface of the second semi-cured resin layer 16 respectively.

In the present embodiment, the method of inserting the conductive parts 20 into the through holes 10x of the core substrate 10 is employed. Therefore, the desmear process or the plating process is not needed after the through holes 10x are formed, and thus the wet processing step in which a burden is imposed on the process management can be reduced.

Figure 4D:
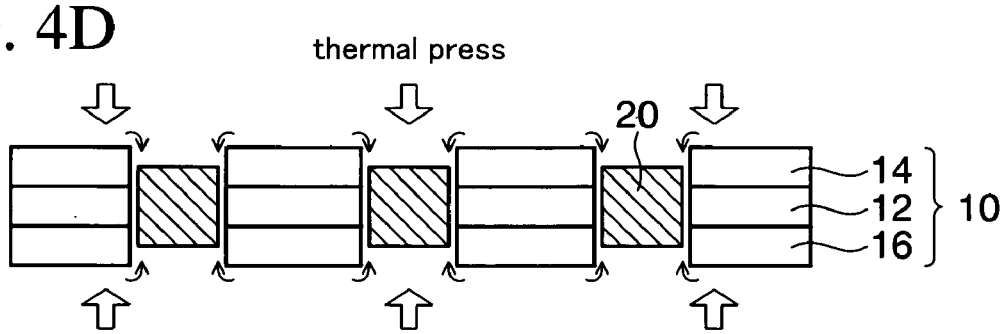

Then, as shown in FIG. 4D, the resultant structure in FIG. 4C is pressurized while heating (thermally pressed) in the vacuum atmosphere (or the low-pressure atmosphere). Thus, the first and second semi-cured resin layers 14, 16 are completely cured. As an example of the thermal press conditions, the conditions of a heating temperature: 200° C., a pushing force: 2.5 MPa, and a process time: 2 hour are preferably employed.

Figure 4E:
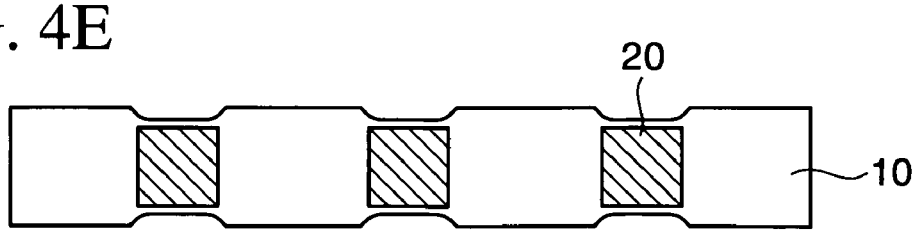

At this time, as shown in FIG. 4D and FIG. 4E, the first and second semi-cured resin layers 14, 16 are cured to flow to the through hole 10x side respectively and then the clearances between the through holes 10x and the conductive parts 20 are filled with the resin. Thus, the conductive parts 20 are fixed completely in the core substrate 10. Also, the resin is made to flow onto upper surfaces and lower surfaces of the conductive parts 20, and then the conductive parts 20 are covered with the resin layer. As a result, core substrate 10 becomes the cured resin layer over the whole.

In the case that the thermo plastic resin layers are employed instead of the first and second semi-cured resin layers 14, 16, the thermo plastic resin layers are re-cured to flow and the clearances between the through holes 10x and the conductive parts 20 are filled with the resin similarly.

Figure 4F:
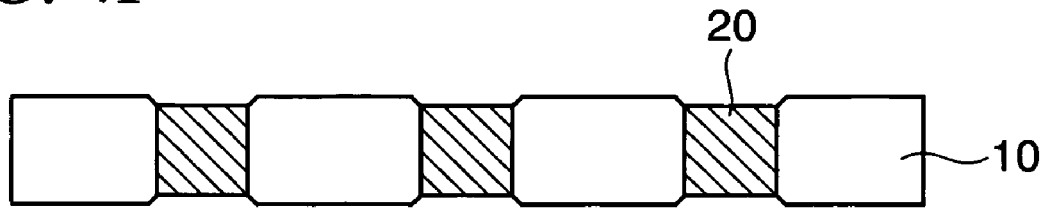

Then, as shown in FIG. 4F, the resin layers on the upper surfaces and the lower surfaces of the conductive parts 20 are removed respectively, and thus the upper surfaces and the lower surfaces of the conductive parts 20 are exposed. In this event, the resin layers on the upper surfaces and the lower surfaces of the conductive parts 20 are removed by any one of the desmear process using a permanganic acid, or the like, the laser process, and the plasma desmear process using a $CF_4/O_2$ gas, or the like, or the process using these methods in combination. Otherwise, both surface sides of the core substrate 10 may be planarized completely by polishing both surface sides of the core substrate 10 until the upper surfaces and the lower surfaces of the conductive parts 20 are exposed.

Figure 4G:
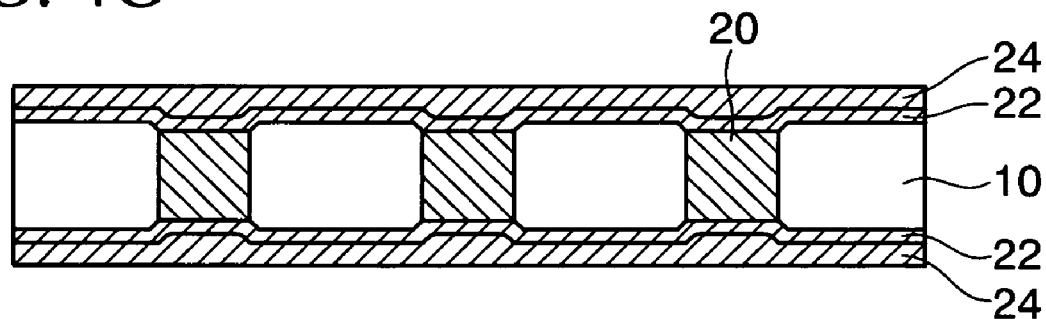

Then, as shown in FIG. 4G, a seed layer 22 made of Cu, or the like is formed on both surfaces of the core substrate 10, into which the conductive parts 20 are inserted, respectively. The seed layer 22 is formed of the electroless plating, the PVD method, or the CVD method. Then, a metal layer 24 is formed on the seed layer 22 on both surface sides of the core substrate 10 by the electroplating utilizing the seed layer 22 as the plating-power feeding layer respectively. The metal layer 24 is made of Cu, or the like, and is formed with a film thickness of 10 to 25 μm by the electroless plating, a current density of which is set to about 1 $A/dm^2$.

In the present embodiment, the clearances between the through holes 10× and the conductive parts 20 are buried with the first and second semi-cured resin layers 14, 16 after the conductive parts 20 are inserted into the through holes 10x of the core substrate 10. Therefore, no area in which the seed layer 22 and the metal layer 24 are not formed is caused, and the seed layer 22 and the metal layer 24 are connected electrically to the conductive parts 20 with good reliability, and are formed.

Figure 4H:
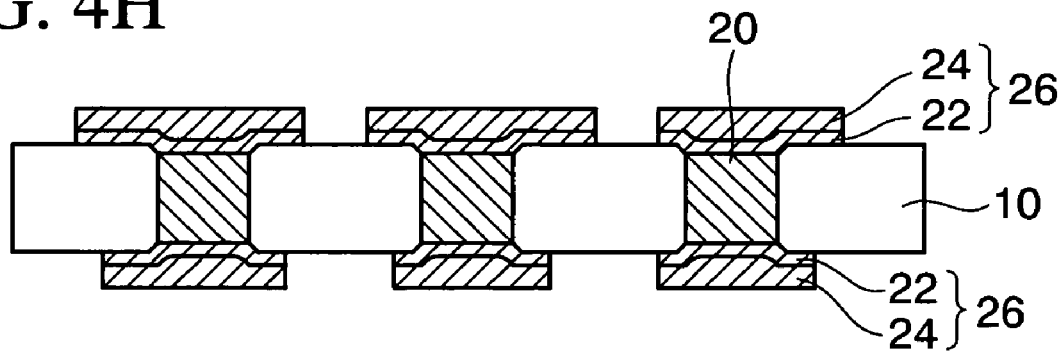

Then, as shown in FIG. 4H, the metal layer 24 and the seed layer 22 on both surface sides of the core substrate 10 are patterned by the photolithography and the etching. Thus, wiring patterns 26 connected mutually via the conductive parts 20 are formed on both surfaces of the core substrate 10 respectively. In this case, the wiring patterns 26 may be formed by another method such as the semi-additive process, or the like.

From the above, the wiring substrate according to the first embodiment of the present invention can be obtained. There may be employed such a mode that an n-layered (n is an integer that is 1 or more) built-up wiring layer connected to the wiring patterns 26 is formed on one surface or both surfaces of the wiring substrate of the present embodiment.

Then, for example, the electronic parts such as a semiconductor chip, or the like is mounted onto the connection portions of the uppermost wiring patterns on one surface side of the core substrate 10, and then the connection portions of the uppermost wiring patterns on the other surface side of the core substrate 10 are connected electrically to the mother board.

As described above, in the method of manufacturing the wiring substrate according to the first embodiment, first, the core substrate 10 having the structure in which the cured resin layer 12 is put between the first semi-cured resin layer 14 and the second semi-cured resin layer 16 is prepared. Then, the through holes 10x passing through the core substrate 10 are formed, and then the conductive parts 20 whose length is shorter than the thickness of the core substrate 10 are inserted into the through holes 10x.

Then, the first and second semi-cured resin layers 14, 16 of the core substrate 10 are cured while causing to flow by the thermal press. Thus, the clearances between the through holes 10x of the core substrate 10 and the conductive parts 20 are filled with the resin, and thus the conductive parts 20 are fixed completely in the core substrate 10.

Then, the resin layers that are made to flow on the upper surfaces and the lower surfaces of the conductive parts 20 are removed, and thus the upper surfaces and the lower surfaces of the conductive parts 20 are exposed. Then, the wiring patterns 26 connected mutually via the conductive parts 20 are formed on both surface sides of the core substrate 10 respectively.

In this manner, in the method of manufacturing the wiring substrate according to the present embodiment, since manufacturing steps can be reduced rather than the case where the conductive layer is formed in the through holes 10x of the core substrate 10 by the plating, a reduction in production cost can be attained. Also, since the step of applying the chemicals can be reduced, a burden concerning the chemicals management can be reduced remarkably.

Besides, the clearances between the through holes 10x and the conductive parts 20 are filled readily with the first and second semi-cured resin layers 14, 16. Therefore, the wiring patterns 26 can be connected to the conductive parts 20 with good reliability, and thus production yield and reliability of the wiring substrate can be improved.

Next, variations of the first embodiment will be explained hereunder.

Figure 5:
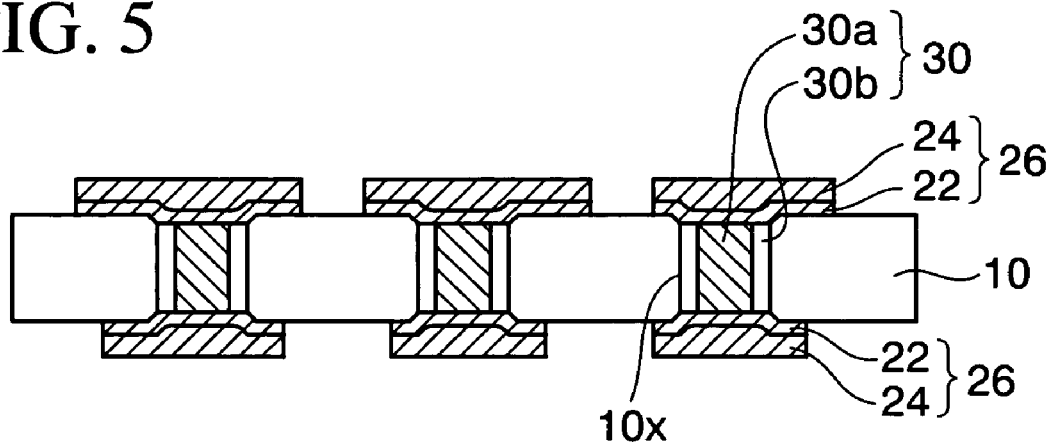
FIG. 5 is a sectional view showing a wiring substrate according to a variation 1 of the first embodiment of the present invention.

A wiring substrate according to a variation 1 of the first embodiment is shown in FIG. 5. As shown in FIG. 5, in the variation 1, instead of the conductive parts 20 formed of the metal post, a coaxial type conductive parts 30 composed of a metal post 30a and an insulator 30b coated on an outer peripheral portion of the metal post 30a is employed. As the insulator 30b, an epoxy resin, a polyimide resin, a polyamide resin, or the like is preferably employed.

In the variation 1, the overall core substrate 10 is formed of the cured resin layer finally by the thermal press, and the coaxial type conductive parts 30 are inserted into the through holes 10x of the core substrate 10. In the variation 1, the core substrate having the above structure in which the cured resin layer 12 is put between the first semi-cured resin layer 14 and the second semi-cured resin layer 16 is employed as the core substrate 10. Then, the wiring substrate can be manufactured by the same manufacturing method as the first embodiment after the coaxial type conductive parts 30 are inserted into the through holes 10x of the core substrate 10.

Figure 6:
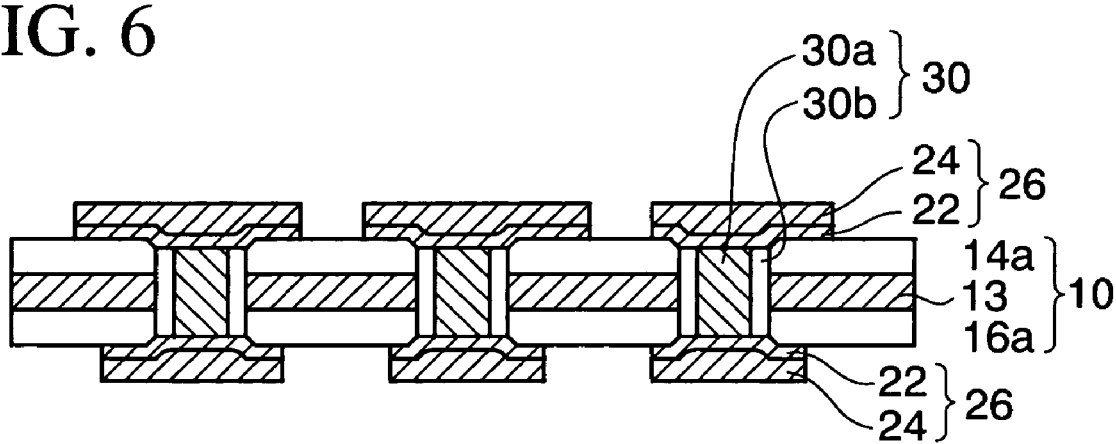
FIG. 6 is a sectional view showing a wiring substrate according to a variation 2 of the first embodiment of the present invention.

A wiring substrate according to a variation 2 of the first embodiment is shown in FIG. 6. As shown in FIG. 6, in the variation 2, the core substrate 10 has such a structure that a metal plate 13 is put between a first cured resin layer 14a and a second cured resin layer 16a finally by the thermal press, and the coaxial type conductive parts 30 are inserted into the through holes 10x of the core substrate 10. In the variation 2, first, the core substrate having the structure in which the metal plate 13 is put between the first semi-cured resin layer 14 and the second semi-cured resin layer 16 as mentioned above is employed as the core substrate 10. Then, the wiring substrate can be manufactured by the same manufacturing method as the first embodiment after the coaxial type conductive parts 30 having the above structure are inserted into the through holes 10x of the core substrate 10.

In the variation 2, the metal plate 13 is present in the inside of the core substrate 10, but the electrical short-circuit between the coaxial type conductive parts 30 can be prevented by the insulator 30b coated on the outer peripheral portion of the coaxial type conductive parts 30.

Second Embodiment

FIGS. 7A to 7H are sectional views showing a method of manufacturing a wiring substrate according to a second embodiment of the present invention sequentially.

A difference of the second embodiment from the first embodiment resides in that the conductive parts whose length is longer than the thickness of the core substrate is employed. In the second embodiment, detailed explanation of the same steps as those in the first embodiment will be omitted herein.

Figure 7A:
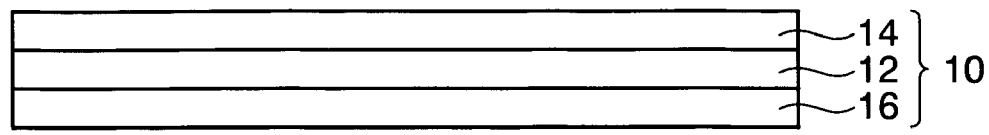
FIGS. 7A to 7H are sectional views showing a method of manufacturing a wiring substrate according to a second embodiment of the present invention.
Figure 7B:
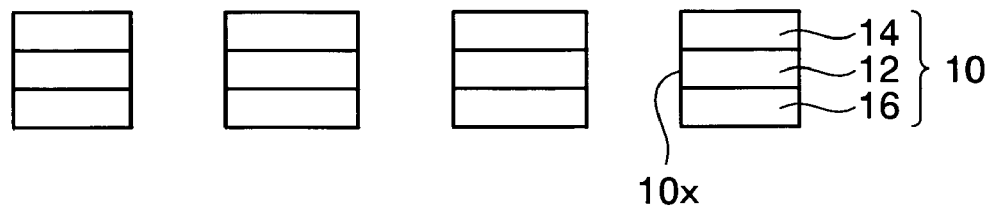

In the method of manufacturing the wiring substrate according to the second embodiment of the present invention, as shown in FIG. 7A and FIG. 7B, like the first embodiment, the through holes 10x are formed in the core substrate 10 having the structure in which the cured resin layer 12 is put between the first semi-cured resin layer 14 and the second semi-cured resin layer 16.

Figure 7C:
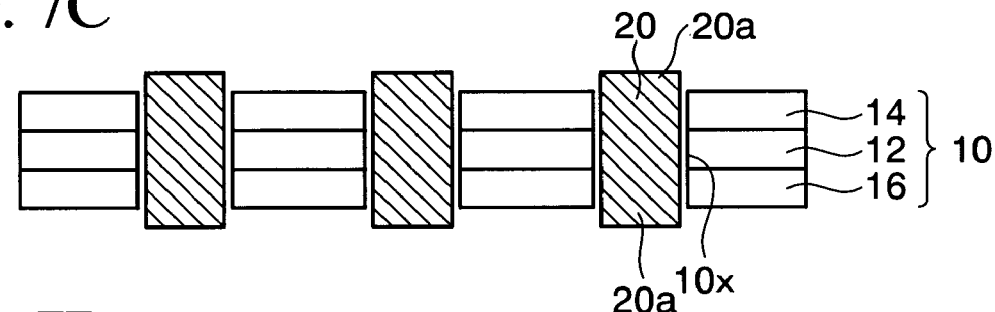

Then, as shown in FIG. 7C, the conductive parts 20 are inserted into the through holes 10x of the core substrate 10. In the second embodiment, the conductive parts whose length in the insertion direction is longer than the thickness of the core substrate 10 is employed as the conductive parts 20, and also the conductive parts 20 are arranged to have a projected portion 20a that is projected from exposed surfaces of the first semi-cured resin layer 14 and the second semi-cured resin layer 16 respectively. Also, like the first embodiment, the clearance is produced between the through holes 10x of the core substrate 10 and the conductive parts 20 in this step.

Figure 7D:
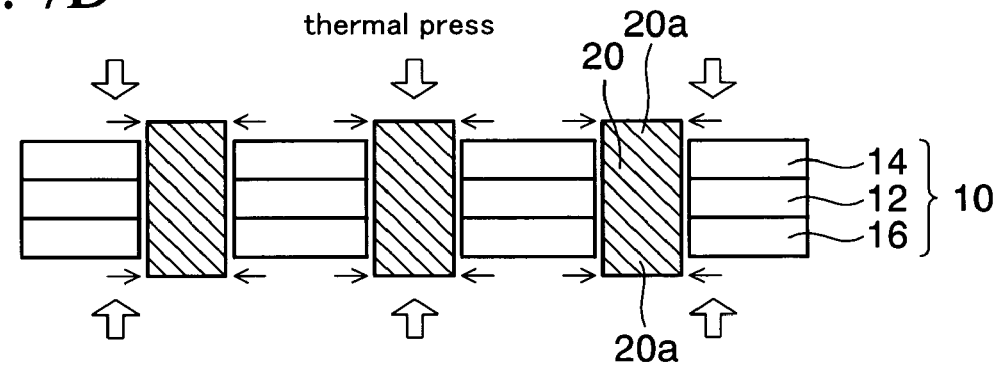
Figure 7E:
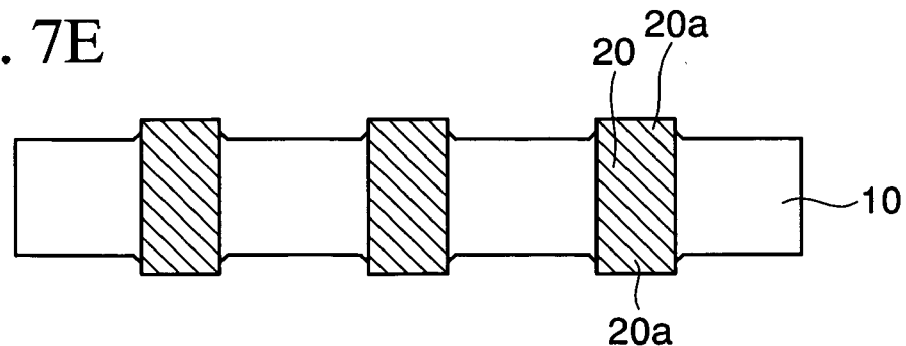

Then, as shown in FIG. 7D, like the first embodiment, the core substrate 10 is pressurized while heating (thermally pressed) in the vacuum atmosphere (or the low-pressure atmosphere). Thus, as shown in FIG. 7D and FIG. 7E, the first and second semi-cured resin layers 14, 16 of the core substrate 10 are completely cured to flow to the through hole 10x side respectively, and the clearances between the through holes 10x and the conductive parts 20 are filled with the resin. Thus, the conductive parts 20 are fixed completely in the core substrate 10. As a result, the core substrate 10 becomes the cured resin layer over the whole.

Figure 7F:
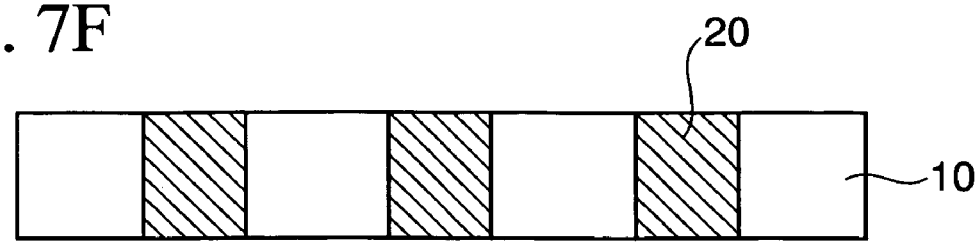

Then, as shown in FIG. 7F, the projected portions 20a of the conductive parts 20 (e.g., Cu posts) projected from both surface sides of the core substrate 10 are removed by the polishing or the etching. Thus, the upper surfaces and the lower surfaces of the conductive parts 20 are planarized to constitute the almost coplanar surfaces with the upper surface and the lower surface of the core substrate 10 respectively.

When the polishing is employed, the buffing, the tape polishing, or the CMP (Chemical Mechanical Polishing) is employed. When the etching is employed, iron (III) chloride aqueous solution, copper (II) chloride aqueous solution, or ammonium peroxodisulfate aqueous solution is employed as the etchant.

At this time, the conductive parts 20 are fixed completely to the core substrate 10. Therefore, in polishing the projected portions 20a of the conductive parts 20, there is no possibility that the conductive parts 20 drop out from the core substrate 10, and thus the projected portions 20a of the conductive parts 20 can be polished stably. Also, since no clearance between the conductive parts 20 and the core substrate 10 is present, there is no possibility that the etchant sinks into the clearance and also unnecessary etching of the conductive parts 20 can be prevented even when the projected portions 20a of the conductive parts 20 are removed by the etching.

Figure 7G:
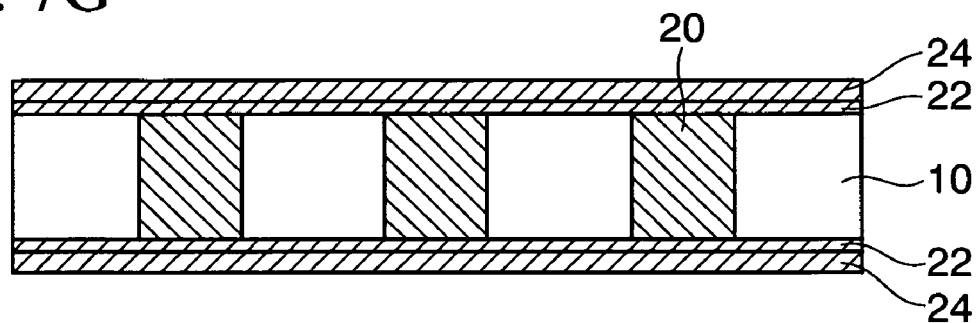

Then, as shown in FIG. 7G, like the first embodiment, the seed layer 22 is formed on both surfaces of the core substrate 10, into which the conductive parts 20 are inserted, respectively. Then, the metal layer 24 is formed on the seed layer 22 on both surface sides of the core substrate 10 by the electroplating utilizing the seed layer 22 as the plating-power feeding layer respectively.

Figure 7H:
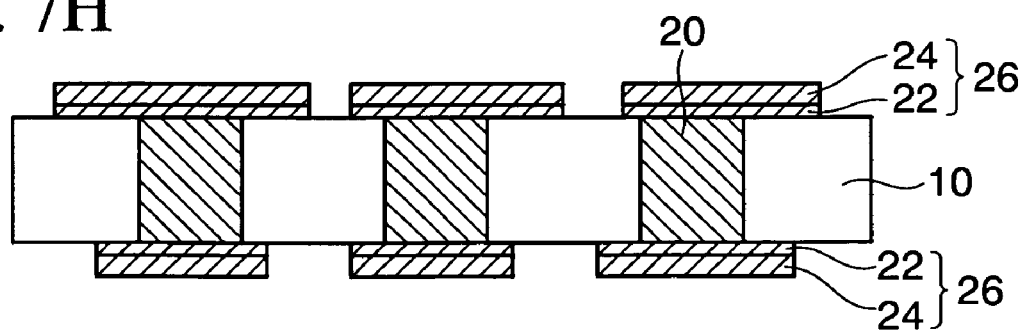

Then, as shown in FIG. 7H, like the first embodiment, the metal layer 24 and the seed layer 22 on both surface sides of the core substrate 10 are patterned. Thus, the wiring patterns 26 connected mutually via the conductive parts 20 are formed on both surfaces of the core substrate 10 respectively.

With the above the wiring substrate according to the first embodiment of the present invention can be obtained.

The second embodiment can achieve the advantages similar to the first embodiment. In addition to this, even though the conductive parts whose length is longer than the thickness of the core substrate 10 are employed as the conductive parts 20, both surfaces of the core substrate can be planarized without any disadvantage. Thus, the wiring patterns 26 connected mutually via the conductive parts 20 can be formed on both surfaces of the core substrate 10 with good reliability respectively.

Next, variations of the second embodiment will be explained hereunder.

Figure 8:
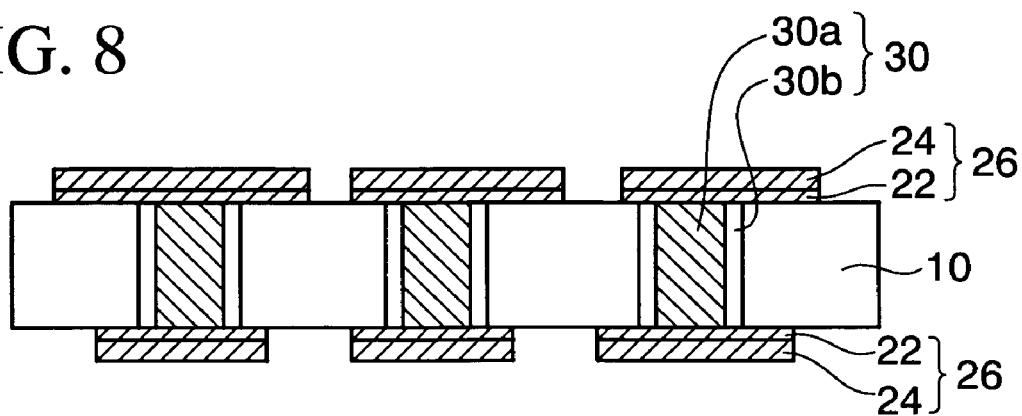
FIG. 8 is a sectional view showing a wiring substrate according to a variation 1 of the second embodiment of the present invention.

A wiring substrate according to a variation 1 of the second embodiment is shown in FIG. 8. As shown in FIG. 8, in the variation 1, the overall core substrate 10 is formed of the cured resin layer finally by the thermal press, and the coaxial type conductive parts 30 are inserted into the through holes 10x of the core substrate 10. In the variation 1, the core substrate having the above structure in which the cured resin layer 12 is put between the first semi-cured resin layer 14 and the second semi-cured resin layer 16 is employed as the core substrate 10. Then, the wiring substrate can be manufactured by the same manufacturing method as the second embodiment after the coaxial type conductive parts 30 similar to the variation of the first embodiment are inserted into the through holes 10x of the core substrate 10.

In the step of removing the projected portions of the coaxial type conductive parts 30, the metal posts 30a and the insulators 30b are polished simultaneously and planarized.

Figure 9:
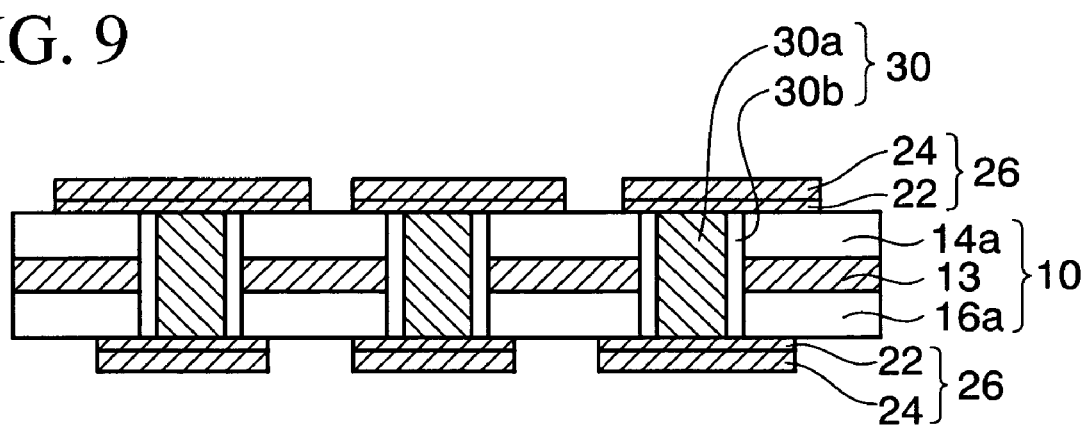
FIG. 9 is a sectional view showing a wiring substrate according to a variation 2 of the second embodiment of the present invention.

A wiring substrate according to a variation 2 of the second embodiment is shown in FIG. 9. As shown in FIG. 9, in the variation 2, the core substrate 10 has such a structure that the metal plate 13 is put between the first cured resin layer 14a and the second cured resin layer 16a finally by the thermal press, and the coaxial type conductive parts 30 are inserted into the through holes 10x of the core substrate 10. In the variation 2, first, the core substrate having the structure in which the metal plate 13 is put between the first semi-cured resin layer 14 and the second semi-cured resin layer 16 as mentioned above is employed as the core substrate 10. Then, the wiring substrate can be manufactured by the same manufacturing method as the second embodiment after the coaxial type conductive parts 30 are inserted into the through holes 10x of the core substrate 10.

In the variation 2, like the variation 2 of the first embodiment, the metal plate 13 is present in the inside of the core substrate 10, but the electrical short-circuit between the coaxial type conductive parts 30 can be prevented by the insulator 30b coated on the outer peripheral portion of the coaxial type conductive parts 30.

What is claimed is:

1. A method of manufacturing a wiring substrate, comprising the steps of:
    preparing a substrate including a resin layer selected from among a semi-cured resin layer and a thermo plastic resin layer;
    forming a through hole that passes through the substrate;
    inserting a conductive parts in the through hole;
    curing the selected resin layer of the substrate in a state that the selected resin layer is made to flow by applying a heat and a pressure to the substrate, and filling a clearance between the through hole and the conductive parts with the selected resin layer; and
    forming a wiring pattern, which is connected mutually via the conductive parts, on both surface sides of the substrate.

2. A method of manufacturing a wiring substrate, according to claim 1, wherein the substrate is composed of a rigid substrate, a first semi-cured resin laye formed on a lower surface of the rigid substrate.

3. A method of manufacturing a wiring substrate, according to claim 2, wherein the rigid substrate is formed of a cured resin layer, and the conductive parts is formed of a metal post or a metal post whose outer peripheral portion is coated with an insulator.

4. A method of manufacturing a wiring substrate, according to claim 2, wherein the rigid substrate is formed of a metal plate, and the conductive parts is formed of a metal post whose outer peripheral portion is coated with an insulator.

5. A method of manufacturing a wiring substrate, according to claim 1,
    wherein a length of the conductive parts in an insertion direction is shorter than a thickness of the substrate,
    in the step of filling the clearance between the through hole and the conductive parts with the selected resin layer, the selected resin layer is made to flow and is formed on an upper surface and a lower surface of the conductive parts, and
    further comprising the step of:
    removing the selected resin layer on the upper surface and the lower surface of the conductive parts, before the step of forming the wiring pattern.

6. A method of manufacturing a wiring substrate, according to claim 1,
    wherein a length of the conductive parts in an insertion direction is longer than a thickness of the substrate,
    in the step of inserting the conductive parts in the through hole, the conductive parts is inserted to have a projected portion projecting from an upper surface and a lower surface of the substrate respectively, and further comprising the step of:

removing the projected portion of the conductive parts to planarize, after the step of filling te clearance between the through hole and the conductive parts with the selected resin layer but before the step of forming the wiring pattern.

7. A method of manufacturing a wiring substrate, according to claim 5, wherein the step of removing the selected resin layer on the upper surface and the lower surface of the conductive parts is executed by a desmear process, a laser process, and a plasma process, or their combination.

8. A method of manufacturing a wiring substrate, according to claim 6, wherein the step of removing the projected portion of the conductive parts to planarize is executed by a polishing or a wet etching.

9. A method of manufacturing a wiring substrate, according to claim 1, wherein a conductive portion of the conductive parts is formed of copper, nickel, solder, or their alloy.

10. A method of manufacturing a wiring substrate, according to claim 3, wherein the insulator for covering the metal post is made of an epoxy resin, a polyimide resin, or a polyamide resin.

\* \* \* \* \*